US006789248B1

(12) United States Patent
Lu et al.

(10) Patent No.: US 6,789,248 B1
(45) Date of Patent: Sep. 7, 2004

(54) METHOD AND APPARATUS TO PERFORM RESISTANCE AND CAPACITANCE (RC) PARAMETER CUSTOMIZATION FOR BETTER TIMING CLOSURE RESULTS IN PHYSICAL SYNTHESIS AND OPTIMIZATION

(75) Inventors: Lee-Chung Lu, Taipei (TW); Cliff Hou, Taipei (TW); Chia-Lin Cheng, Tao-Yuan (TW); Chung-Hsing Wang, Baushun (TW); Hsing-Chien Huang, Hsinchu (TW); Yee-Wen Chen, Hsinchu (TW); Tsui-Ping Wang, Hsinchu (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 41 days.

(21) Appl. No.: 10/178,401

(22) Filed: Jun. 24, 2002

(51) Int. Cl.[7] .............................................. G06F 17/50
(52) U.S. Cl. ................................ 716/18; 716/2; 716/6; 716/12
(58) Field of Search ............................. 716/2, 5, 6, 12, 716/7, 9, 18

(56) References Cited

U.S. PATENT DOCUMENTS

| | | | | |
|---|---|---|---|---|
| 5,629,860 A | | 5/1997 | Jones et al. ................ | 364/490 |
| 5,815,406 A | | 9/1998 | Golla et al. ................ | 364/490 |
| 5,883,814 A | * | 3/1999 | Luk et al. ..................... | 716/2 |
| 6,080,201 A | | 6/2000 | Hojat et al. .................. | 703/14 |
| 6,145,117 A | | 11/2000 | Eng ............................. | 716/18 |
| 6,189,131 B1 | | 2/2001 | Graef et al. .................. | 716/8 |
| 6,279,142 B1 | | 8/2001 | Bowen et al. ................ | 716/5 |
| 6,725,438 B2 | * | 4/2004 | van Ginneken .............. | 716/2 |

OTHER PUBLICATIONS

Avant! Product Overview.
"Physical Synthesis: Design Tools and Flows for Sub-Quarter Micron, System-On-a-Chip Design Implementation", May 1999 Synopsys, Inc., Mountain View, CA, pp. 2–15.

* cited by examiner

Primary Examiner—Thuan Do
(74) Attorney, Agent, or Firm—George O. Saile; Stephen B. Ackerman; Billy Knowles (57) ABSTRACT

A method and system for the design of an electronic device adjusts the resistance and capacitance values employed in preliminary timing analysis during physical synthesis of the electronic device. The physical synthesis uses resistance and capacitance unit values to determine the listing of the component circuits. The resistance and capacitance unit values are calibrated by preliminarily placing the initially synthesized component circuits to create a listing describing physical locations of the component circuits within the electronic device. A preliminary routing of the interconnections is performed to create a listing describing a network of physical wire segments that form each interconnection of the component circuits. A timing analysis of the electronic device determines the delay created by the component circuit and the networks of physical wire segments. The time delay resulting from the physical interconnects is extracted from the timing analysis of the electronic device and from the timing estimate performed during the physical synthesis. The time delay of the physical interconnection from the timing analysis and the timing estimate performed during the physical synthesis is then compared. The resistance and capacitance unit values used during the timing synthesis are then adjusted. The calibration is repeatedly executed until time delay of the physical interconnection from the timing analysis and the timing estimate performed during the physical synthesis are correlated.

23 Claims, 7 Drawing Sheets

METHOD AND APPARATUS TO PERFORM RESISTANCE AND CAPACITANCE (RC) PARAMETER CUSTOMIZATION FOR BETTER TIMING CLOSURE RESULTS IN PHYSICAL SYNTHESIS AND OPTIMIZATION

BACKGROUND OF THE INVENTION

1. Field of the Invention

This invention relates generally to computing methods and systems that facilitate electronic design automation of integrated circuitry. More specifically this invention is related to methods and apparatus that adjust resistance and capacitance parameters in a library database containing a description of circuits and constraints of an integrated circuit fabricating process. The library database is used in a physical synthesis program module of a design automation system.

2. Description of Related Art

Figure 1:
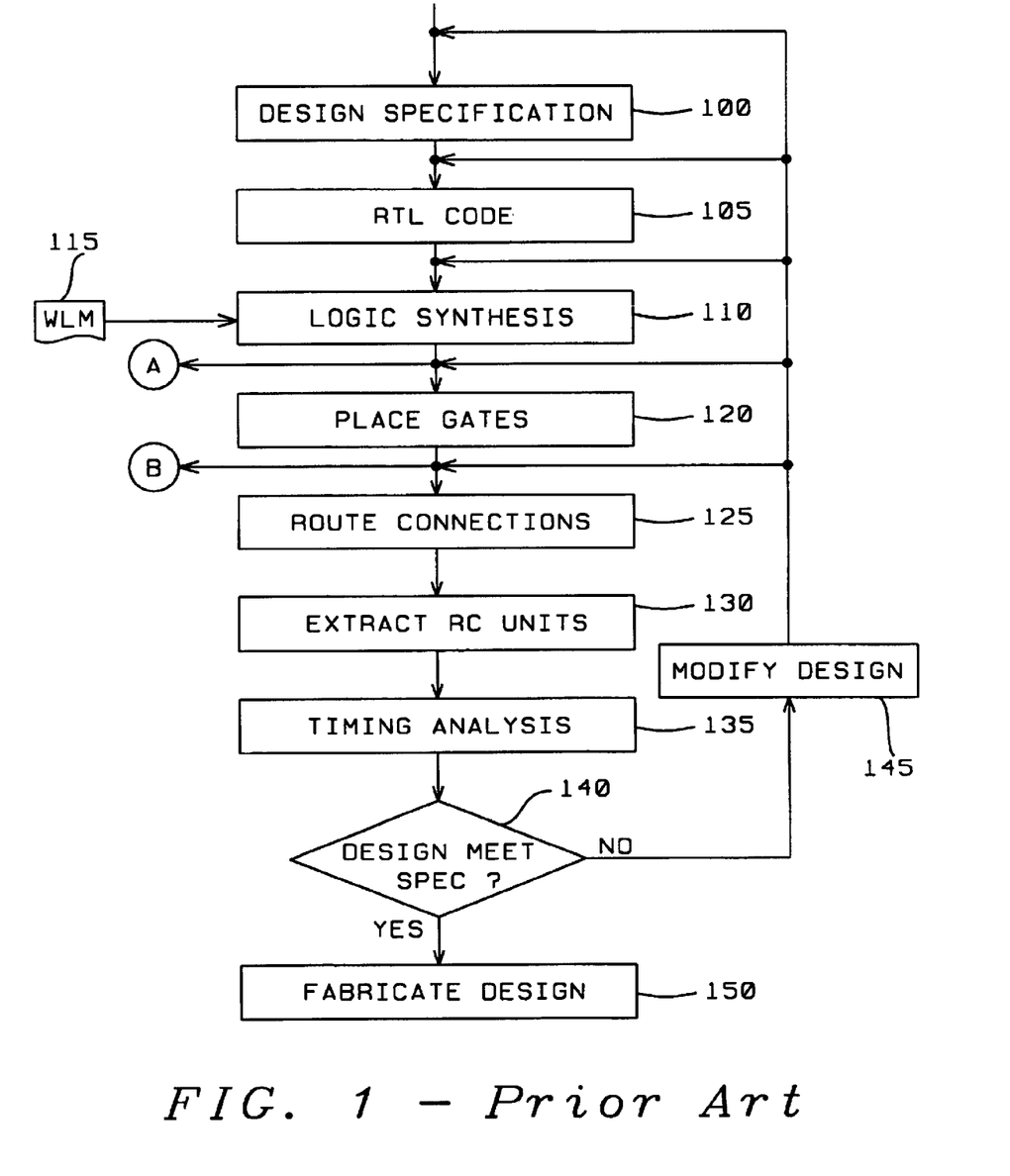
FIG. 1 is a process flow diagram of an electronic design automation system of the prior art.

The structure of the methods and systems used to design and prepare an integrated circuit for fabrication is well known in the art. Referring to FIG. 1, the integrated circuit design begins with creation (Box 100) of a high-level circuit spefication. The high-level circuit specification details the function of the integrated circuit, and the constraints of the integrated circuit such as physical size, voltage levels, current levels, power dissipation, frequency, and environmental factors (temperature, etc.). The circuit function is translated to a logic design written in a hardware description language such as VHDL (Very High Speed Integrated Circuit Hardware Description Language) or Verilog Hardware Description Language.

Generally, the structure of the integrated circuit is in register transfer language (RTL) and the hardware descriptor language is structured as the RTL code (Box 105). The RTL code (Box 105) is transferred to a program system that generates or synthesizes (Box 110) a circuit or gate level design from the hardware description of the integrated circuit. The logic synthesis (Box 110) provides the initial description of the physical structure that the integrated circuit is to have. The logic synthesis (Box 110) in what is termed timing driven design performs a rough estimate of the delays of each circuit of the design including the intrinsic delay of each circuit and an estimate of the timing delays caused by the interconnecting wiring. The logic synthesis (Box 110) employs a wire load model (WLM) (Box 115) to provide an estimate of the timing delays that result from the interconnecting wiring.

The wire load model is a statistical model that provides an estimate of wiring length for a path based on the type of path (long path, short path, control logic, functional logic, array data path, or array control path) and some historic statistics for the particular circuit path types. Further, it is known that certain functions will be grouped and therefore circuit paths within a function have one estimated length while inter-function circuit paths will have a different length (longer). Based on the statistical data and certain constraints and estimates, the logic synthesizer can provide a rough prediction of the timing delays for the circuit paths of an integrated circuit.

Once the logic synthesis (Box 110) is completed, the circuits are then placed (Box 120) based on the constraints developed in the design specification (Box 100) and during the logic synthesis (Box 110). After the circuits are placed (Box 120), the interconnecting wiring is routed (Box 125). This defines the actual structure of each segment of the printed circuit wiring of the integrated circuit. The wiring is generally placed on multiple levels and is routed in horizontal and vertical directions depending on the level of the wire routing.

The completed wire routing description is used to extract (Box 130) the resistance and capacitance values for each segment of all the wiring interconnections of the integrated circuit. This is the first opportunity for a true statistical timing analysis to determine the performance of the integrated circuit. The resistance and capacitance of each segment of the interconnecting wiring is generally determined employing a three-dimensional solver. The three dimensional solver calculates the resistance of the segments based on the cross-sectional area and length of each segment and the resistivity ($\rho$) of the interconnecting wiring segments. The three dimensional solver calculates the capacitance based on the surface area of the wiring, the distance to the adjoining wiring segments or the semiconductor substrate, and the dielectric constant ($\epsilon$) of the intervening insulator. These calculated resistances and capacitances are relatively accurate and allow a timing analysis (Box 135) that predicts the performance of the integrated circuit precisely within the bounds of the process variations. The design of the integrated circuit is evaluated (Box 140) to establish if the design complies with the design specification. If the design specification is not met the design is appropriately modified (Box 145) and the process repeated. If the design complies with the specification, the design is then fabricated (Box 150)

Figure 4A:
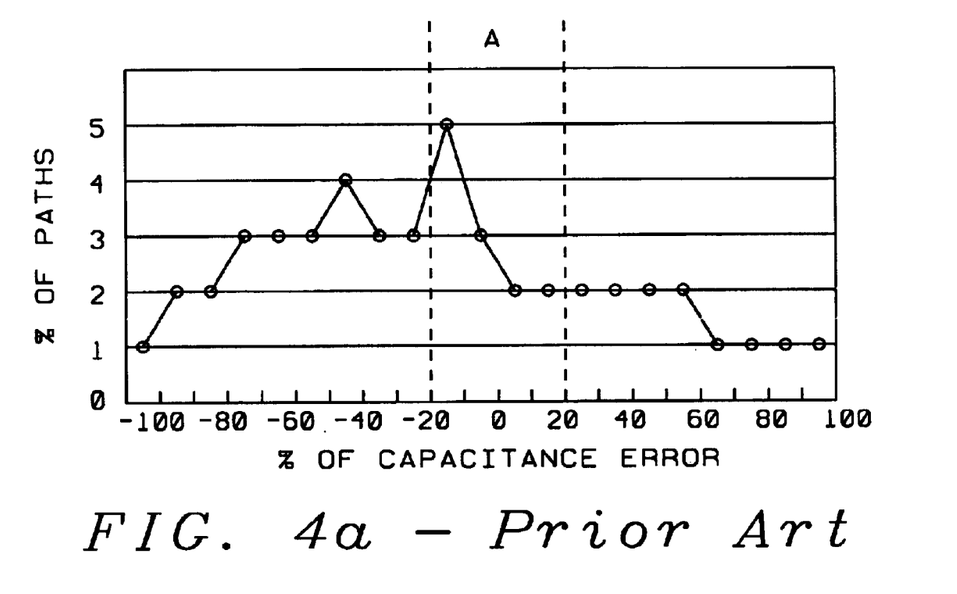
FIGS. 4a and 4b are graphs of illustrating the error between the capacitance of circuit interconnections estimated during synthesis and the capacitance of circuit interconnections calculated from actual physical wiring design of the prior art.

It is well known in the art that, as the lithography of the semiconductor processing has improved to allow minimum feature size to decrease from 0.5 $\mu$m to 0.25 $\mu$m to approaching 0.18 $\mu$m and event to 0.1 $\mu$m, the proportion of the delay of a circuit path that is attributable to the interconnections has increased. The increase has been from approximately 20% at 0.5 $\mu$m to approximately 45% at 0.25 $\mu$m to approximately 60% at 0.18 $\mu$m and smaller. Further, as shown in FIG. 4a, the error in the capacitance used by the WLM model to estimate the path delay at the logical synthesis versus the actual capacitance as determined during the resistance and capacitance extraction (Box 130) is greater than +/−20% (region A) for more than 50% of the paths of the integrated circuit. When the timing delay that resulted from the interconnections was a smaller proportion of the total path delay, the error had less an impact than when the interconnections become the dominant component of the total path delay.

Figure 2:
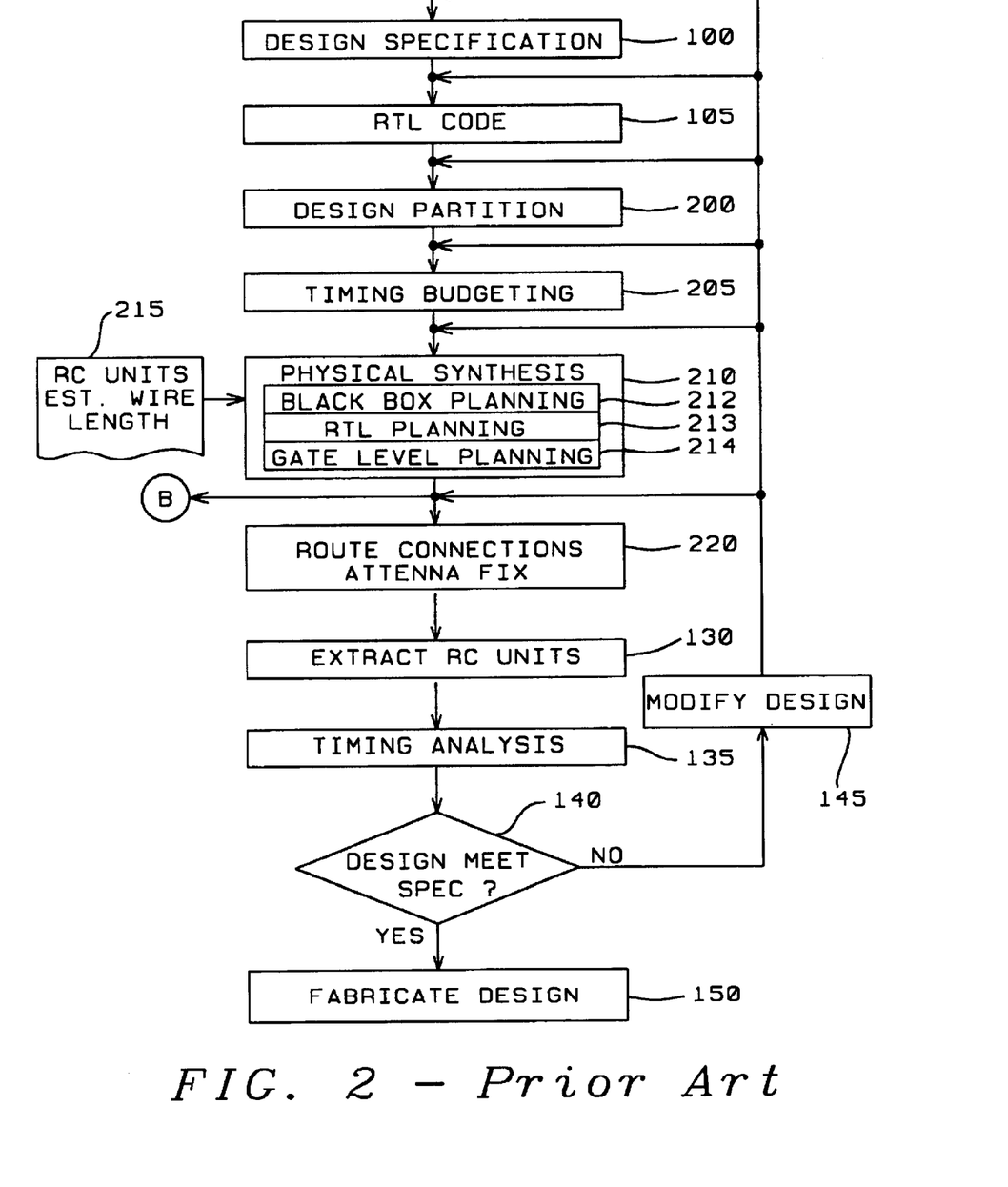
FIG. 2 is a process flow diagram of an electronic design automation system of the prior art.

Logical synthesis provided a logical design with only rudimentary consideration to the physical structure of the integrated circuit To refine the estimate of timing delay and its impact on performance of the integrated circuit logical synthesis, logical synthesis was replaced with physical synthesis. Refer now to FIG. 2 for a discussion of an electronic design automation process. The design specification is created essentially as described above, with creation (Box 100) of a high-level circuit specification. The high-level circuit specification details the function of the integrated circuit, and the constraints of the integrated circuit such as physical size, voltage levels, current levels, power dissipation, frequency, and environmental factors (temperature, etc.). The high-level circuit specification is then translated (Box 105) to the Register Transfer Language Coding. The RTL coding (Box 105) is not complete as in the Electronic Design process of FIG. 1. Newly designed circuit functions are described functionally, without the detailed RTL coding. Current integrated circuit designs further have predesigned circuit functions such as memory arrays, microprocessors, etc.

The integrated circuit design is partitioned (Box 200) to allocate the functional units of the integrated circuit design to unique physical areas of the substrate onto which the integrated circuit is to be fabricated. The circuit specification contains certain performance and timing criteria that are to be achieved by the integrated circuit. These timing and performance constraints are then budgeted (Box 205) and allotted to the appropriate functional units of the integrated circuit design.

The RTL coding (Box 105) is now transferred to a physical synthesizer to create the initial schematic description of the integrated circuit. Physical synthesis (Box 210), as described in "Physical Synthesis: Design Tools and Flows for Sub-Micron, System-On-a-Chip Design Implementation," Synopsis, Inc., Mountain View Calif., May 1999, brings key physical functions into the front-end process that allow an integrated circuit design to have the impact of the physical implementation of the design considered earlier in the process. Many of these predesigned circuit functions are completely designed to the final wiring levels and only need to have interconnections made to other functions on the integrated circuit. Consequently, the timing analysis for these predesigned circuits is complete and well understood.

Physical Synthesis (Box 210) consists of three major components, Black Box Planning (Box 212), RTL Planning (Box 213), and Gate Level Planning (Box 214). Black Box Planning (Box 212). Black Box Planning actually occurs before the RTL code for those circuits that are being designed specifically for the integrated circuit. The inputs to Black Box Planning are:

A netlist defining the interconnections of the major functions of the integrated circuit.

Timing and physical models for predesign circuits.

The timing design constraints for each of the major functions.

The input/output (I/O) placement specification for the whole integrated circuit and for the major functions, particularly the predesigned circuit function.

Black Box Planning initially creates a floorplan defining the tentative arrangement of the integrated circuit on a semiconductor substrate. The size and timing of the predesigned circuit functions is known, but the timing and area of the newly designed circuit functions is estimated. Previous experience is used to estimate the block size and timing to create "black boxes" defining the newly designed circuit functions. Later, when the actual RTL code is written for each of the newly designed function, the user-estimated black box models are replaced with gate-level netlists generated by synthesis tools.

Next, power bus planning is performed in order to account for the metal resources that these busses will consume. These busses bring power from the I/O ring into the areas of the predesigned circuit functions and the newly designed circuit functions. Allocating area for these power busses early results in a more accurate view of the design. The integrated circuit's external I/O cells are then placed, usually based on a specification from the board-level design stage. The I/O structures of newly designed circuit functions are automatically assigned and are optimally placed based on connections between various functions of the integrated circuit and the timing constraints. A quick, coarse routing of the interconnections between the circuit functions is performed by a global router. The global router routes each and every net in the design on a coarse grid in order to estimate the interconnect quickly. The global router takes into account the blockages caused by power busses, pre-routed signals, and metal used to connect nets within the circuit functions.

The design is then analyzed for timing and routing congestion and modifications are made to reduce gross timing errors and remove areas that are overly congested for routing. Modifications are done to the locations of the circuit functions on the semiconductor substrate, to the shape of the newly designed circuit functions, and to the placement of the I/O structures of the newly designed circuit functions.

When severe timing and/or congestion problems are found, the design is re-partitioned to minimize the timing and routing problems. The newly designed circuit functions may be divided into other physical units to insure that any congestion of the wiring or timing constraints are minimized.

The outputs of Black Box Planning are an initial floorplan, an estimate of the power consumption and distribution of the integrated circuit, the timing and power constraints of the newly designed circuit function, and an initial routing of the interconnections between the circuit functions.

The RTL Planning stage (Box 213) is similar to Black Box Planning (Box 212) except that the estimated timing and physical models for the newly designed circuit functions are replaced with gate-level netlists generated by a logical synthesis tool or program. The synthesis constraints created in the black box stage are used to quickly create gate-level netlists using a logical synthesis tool. The synthesis tool very quickly creates the gate-level netlist, but in the process, sacrifices some accuracy in return for high performance. The black boxes used for the newly designed circuit functions are replaced with the newly generated netlists. The gates in these estimated netlists are quickly placed to better estimate the timing and area of each of the newly designed circuit functions. Based on these more accurate representations of the newly designed circuit functions, minor refinements are made to the floorplan, I/O structures of newly designed circuit functions, circuit function interconnection routing, and design budgets. In addition, custom ware load models are created for each newly designed circuit function, based on the quick placement of the estimated netlists. The outputs of RTL Planning are custom wire load models for each of the newly designed circuit functions; a refined floorplan, I/O structure locations, Interconnection routing of the circuit functions, and power planning; and refined design budgets for each of the circuit functions.

A gate-level implementation is of the integrated circuit is performed during the Gate-Level Planning stage (Box 214). Each newly designed circuit function is independently synthesized (in parallel) using the custom wire load models and design budgets created and refined in previous design steps (Boxes 212 and 213). The final, detailed cell placement and global routing is performed on each newly designed circuit function (in parallel). Clock trees are synthesized for each newly designed circuit function and for the entire chip. Each newly designed circuit function and the entire integrated circuit are analyzed to insure that timing constraints and goals are achieved and congestion is minimized.

After the analysis during the Gate-level Planning stage (Box 214) any minor modifications of placement are made (Box 220) to adjust any error found in the analysis. A final routing (Box 225) of the interconnections of the circuit functions is performed, generally repair any antennas (modification of the wire to gate or diode area ratio) found in the analysis. Again the resistance and capacitance is extracted (Box 130) by the three-dimensional solver to calculate the exact resistance and capacitance of each segment of the interconnections. A final timing analysis (Box 135) is performed using the extracted (Box 130) resistances and capacitances. The results are analyzed (Box 140) to insure that the physical design of the integrated circuit will perform as required by the design specification. If there are still noncompliances with the design specification the design is modified (Box 145) and the electronic design automation system is reiterated until the design is in compliance. The design is then fabricated (Box 150).

One of the advantages of the physical synthesis is that the timing analysis is now based on a preliminary routing of the interconnections of the circuit functions. A library (Box 215 contains the descriptions of the resistance and capacitance of the various interconnection segments. The timing analysis now is based on the preliminary routing information with a more accurate estimate of the resistance and capacitance for the interconnection segments. However, since the resistance and capacitance of the routed interconnections of the integrated circuit are based on library descriptions rather than actual calculations there are still deviations in the estimates from the actual calculation determined by the three-dimensional solver program.

Figure 4B:
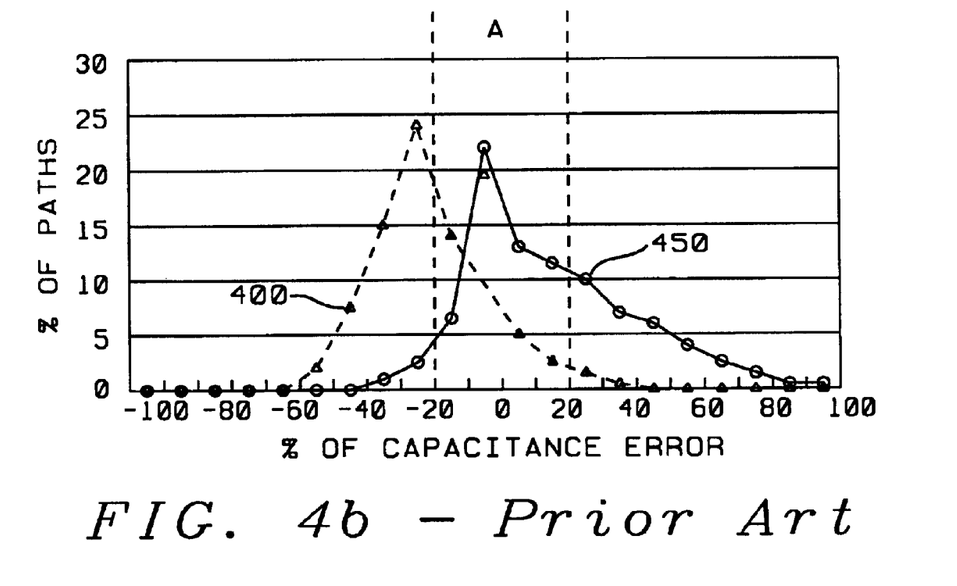

A representative illustration of two different integrated circuit designs 400 and 450 is shown in FIG. 4b. In the first instance 400 approximately 40% of the paths of the integrated circuit have a capacitance error less than +/−20% for the estimate employed by the description from the library 215 of FIG. 2 versus the actual calculation from the resistance capacitance extraction (Box 130) of FIG. 2. In the second instance 450 approximately 51% of the paths of the integrated circuit have a capacitance error less than +/−20% (Region A) for the estimate employed by the description from the library 215 of FIG. 2 versus the actual calculation from the resistance capacitance extraction (Box 130) of FIG. 2. Further, nearly all the capacitance errors for the paths for the first design 400 and second design 450 fall in the range of +/−60%. This is a significantly better estimate than is accomplished using the wire load model of FIG. 4a. As the minimum feature size has decreased from 0.6 $\mu$m to 0.25 $\mu$m, the proportion of the path delay through the circuit functions for the interconnections has increased from 20% to 40%. Thus the overall effect of the improvement of the estimate is in effect nullified, since the impact of the interconnections on the path delay is increased.

Further, an even more accurate estimate of the resistance and capacitance of the interconnections of the integrated circuit is required during the physical synthesis, as the minimum feature size is again decreased to approach 0.18 $\mu$m. The effect of the resistance and capacitance of the interconnection on the path delay will increase to approach 60% of the total delay. This will increase the impact of the errors between the estimates created by the library 215 versus the actual calculated resistances and capacitances.

Electronic Design Automation tools are well known in the art and are marketed by corporations such as Synopsis, Inc and Avant!, Inc. of Fremont Calif. Avant!, Inc. markets circuit placement and interconnection routing programs under the trade names Apollo and Astro. The Apollo program set provides timing analysis using the library of the resistances and capacitances as described in FIG. 2. Apollo further markets a resistance and capacitance extraction tool under the tradename Star-RCXT, which provides a three-dimensional calculation of resistance and capacitance as shown in FIGS. 1 and 2. Further, Avant! markets a program product under the tradename Raphael that provide the field solver necessary to calculate the resistance and of interconnections and to evaluate current density of interconnections and complex electrical and thermal evaluations.

U.S. Pat. No. 5,629,860 (Jones, et al.) provides a method for determining timing delays associated with the placement of circuit function and routing of the interconnections of an integrated circuit. In particular, Jones et al determines the area of each region wherein a region includes a group or subgroup of circuit functions for use in designing an integrated circuit. Once the area for each region is obtained, substantially more accurate and more design specific wire load model and net parasitics can be obtained. The wire load models or net parasitics can then be supplied to other CAE tools to create a modified netlist. Moreover, the present invention provides a process, which allows the user to account for the resistance and capacitance effects of the interconnections of the circuit functions on a hierarchical block basis. The process to account for the resistance and capacitance effects thus improves the accuracy of the wire placement and routing delay estimate while preserving the performance benefits of a traditional simplified equation.

U.S. Pat. No. 5,815,406 (Golla, et al.) describes a method and system for designing a circuit using the resistance and capacitance and timing weighting of the interconnections of the integrated circuit. The method includes the steps of identifying the circuit functions that are connected by interconnecting wiring and assigning weights to the interconnections in proportion to timing and resistive and capacitive (RC) effects of the interconnection. In the preferred embodiment, the weights are used by a conventional placement program to obtain the final placements.

U.S. Pat. No. 6,080,201 (Hojat, et al.) teaches a method for improving timing convergence in computer aided semiconductor circuit design. In one particular version of the invention, the method includes the steps of generating a behavioral model of a desired semiconductor circuit. The behavioral model includes timing constraints for individual paths in the circuit. The behavioral model is synthesized to produce a netlist, which represents an implementation of the desired semiconductor circuit mapped to a specific semiconductor technology. The netlist includes a list of components in the circuit and a list of interconnecting wires, which connect the components in the circuit. The synthesizing includes performing a timing analysis on the implementation so that the paths in the circuit represented by the netlist meet the timing constraints, the timing analysis being performed using estimated wire lengths for the nets. Next, the components in the netlist are placed into an image representing a predefined area of the semiconductor substrate. During this step, actual wire lengths are determined for the nets in the netlist. Given the actual wire lengths, the steps of synthesizing and placing are then repeated until timing convergence is achieved. Each time the step of synthesizing is repeated, the actual wire lengths from the step of placing are substituted for the estimated wire lengths. Finally, the circuit is routed to produce the final design data.

U.S. Pat. No. 6,145,117 (Eng) discusses creating optimized physical implementations of integrated circuits from high-level descriptions of electronic design using placement-based information. The electronic design automation system provides optimization of RTL models of integrated circuits, to produce detailed constraints and data precisely defining the requirements for the back-end flows leading to design fabrication. The system takes an RTL model of an electronic design and maps it into an efficient, high-level hierarchical representation of the hardware implementation of the design. The hardware representation is partitioned into functional partitions, and a fully characterized performance envelope is created for a range of feasible implementations for each of the partitions, using accurate placement based wire load models. Chip-level optimization selects and refines physical implementations of the partitions to produce compacted, globally routed floorplans. Chip-level optimization iteratively invokes re-partitioning passes to refine the partitions and to recompute the feasible implementations. In this fashion, a multiple-pass process converges on an optimal selection of physical implementations for all partitions for the entire integrated circuit that meet minimum timing requirements and other design goals. The system outputs specific control and data files which thoroughly define the implementation details of the design through the entire back-end flow process, thereby guaranteeing that the fabricated design meets all design goals without costly and time consuming design iterations.

U.S. Pat. No. 6,189,131 (Graef, et al.) explains a method for selecting and synthesizing metal interconnect wires in integrated circuits. The method assigns signals to specific metal layers through the use of interconnect wire load models that are metal layer dependent. The method allows synthesis and layout tools to route signal wires on select metal layers at an early stage in the design process. A technology library is used in designing integrated circuits. In addition to traditional library components such as logic gate information, the technology library includes routing wire load models that are metal layer dependent. The wire load information reflects the electrical properties of signal wires formed on different metal layers, and provides more accurate timing estimates than generic wire delay values. The additional information influences the delay calculations of the synthesis process in such a way that the delay a signal encounters on a specific metal layer can be approximated very closely. A wire-metal layer attribute file is compiled by the synthesis process. The wire-metal layer attribute file output constrains layout tools to route individual signals on specific metal layers. Alternatively, the layout tool can utilize the wire-metal layer attribute file to determine a set of acceptable routing layers, allowing an optimal route for a signal to be chosen in relation to the requirements of other signals.

U.S. Pat. No. 6,279,142 (Bowen, et al.) provides a method of on-chip interconnect design in an integrated circuit (IC). Fast circuit simulations of each interconnection of the circuit functions constituting the integrated circuit are performed for noise margin and slew rate analysis. A resistor/capacitor (RC) network for each net is generated from net lengths, and assignments of parasitic cross-coupling capacitances and shunt capacitances derived from three-dimensional field solver evaluations of pre-routing phase estimated wire geometries. If the noise margin and slew rate criteria are not satisfied for the net under simulation, the simulations are iterated, with a new wire geometry selected between iterations, until the criteria are satisfied. Each net is tagged with a wire geometry that satisfies noise margin and slew rate requirements, which can then be passed to a routing tool.

SUMMARY OF THE INVENTION

An object of this invention is to provide a method and system for the design of an electronic device that adjusts the resistance and capacitance values employed in preliminary timing analysis during physical synthesis of the electronic device.

To accomplish at least this object a method for designing an electronic device begins by creating a preliminary description of the electronic device including constraints to be employed for the design. A physical synthesis of the preliminary description of the electronic device is performed to form a listing of component circuits of the electronic device including a listing of interconnections of the electronic devices. The physical synthesis uses resistance and capacitance unit values to determine the listing of the component circuits.

The resistance and capacitance unit values are calibrated by preliminarily placing the initially synthesized component circuits to create a listing describing physical locations of the component circuits within the electronic device. A preliminary routing of the interconnections is performed to create a listing describing a network of physical wire segments that form each interconnection of the component circuits. A timing analysis of the electronic device determines delay created by the component circuit and the networks of physical wire segments.

The time delay resulting from the physical interconnects is extracted from the timing analysis of the electronic device and from the timing estimate performed during the physical synthesis. The time delay of the physical interconnection from the timing analysis and the timing estimate performed during the physical synthesis is then compared. The resistance and capacitance unit values used during the timing synthesis are then adjusted and the above calibration process is repeated until the physical interconnect delay and the estimated interconnect delay are correlated.

A final physical synthesis is executed and the component circuits are placed to create a listing describing physical locations of the component circuits within the electronic device. A final routing of the interconnections is preformed to create a listing describing a network of physical wire segments that form each interconnection of the component circuits, eliminating any antenna or extra interconnection segments created in previous iterations of the routing of the interconnections. The design of the electronic device is verified to insure that it adheres to the preliminary description of the electronic device and then the design transferred for fabrication.

The preliminary description of the electronic device is either in a hardware descriptor language, a gate level netlist having a description of the component circuits and the interconnections between the component circuits, or a description of the location of the component circuits with descriptions of the interconnections between the component circuits.

DETAILED DESCRIPTION OF THE INVENTION

Figure 3A:
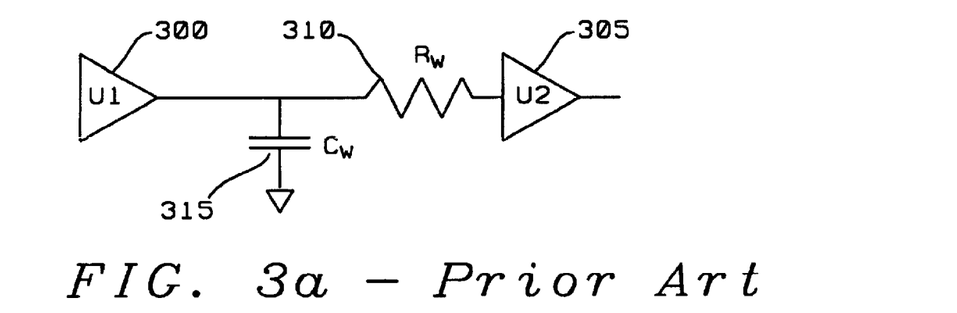
FIGS. 3a and 3b are representative schematics representing a model of functional circuit interconnections of the prior art
Figure 3B:
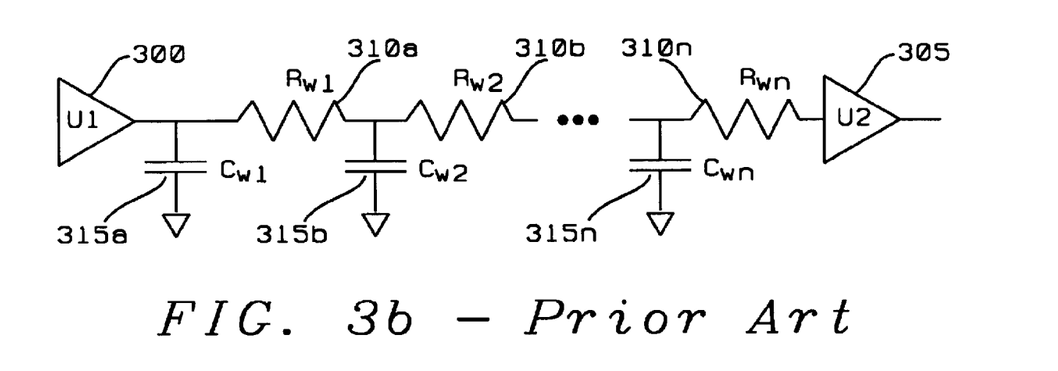

One of the main reasons for the errors in the resistance and capacitance of the library 215 of FIG. 2 versus the actual calculated resistance and capacitance is illustrated in FIGS. 3a and 3b. The functional circuits (illustrated as inverters for simplicity) 300 and 305 are connected by wiring segments of conductive materials such as aluminum, copper, or highly doped polycrystalline silicon. The difference in the resistances and capacitances of each of these segments is dependent on material type and the location of the material relative to adjoining wiring segments and to the semiconductor substrate. The wiring estimations from the wire level model 115 of FIG. 1 or the resistance and capacitance units of the library 215 of FIG. 2 employ a single wiring resistance 310 and single Wiring capacitance 316 to simulate the effects of the interconnection wiring. By representing the interconnecting wiring as distributed segments more representative of the final actual Wiring segments, the resistances 310a, ..., 310n and the capacitances 310a, ..., 310n are more representative of the effects of the actual wiring of the interconnections of the integrated circuit.

Figure 5A:
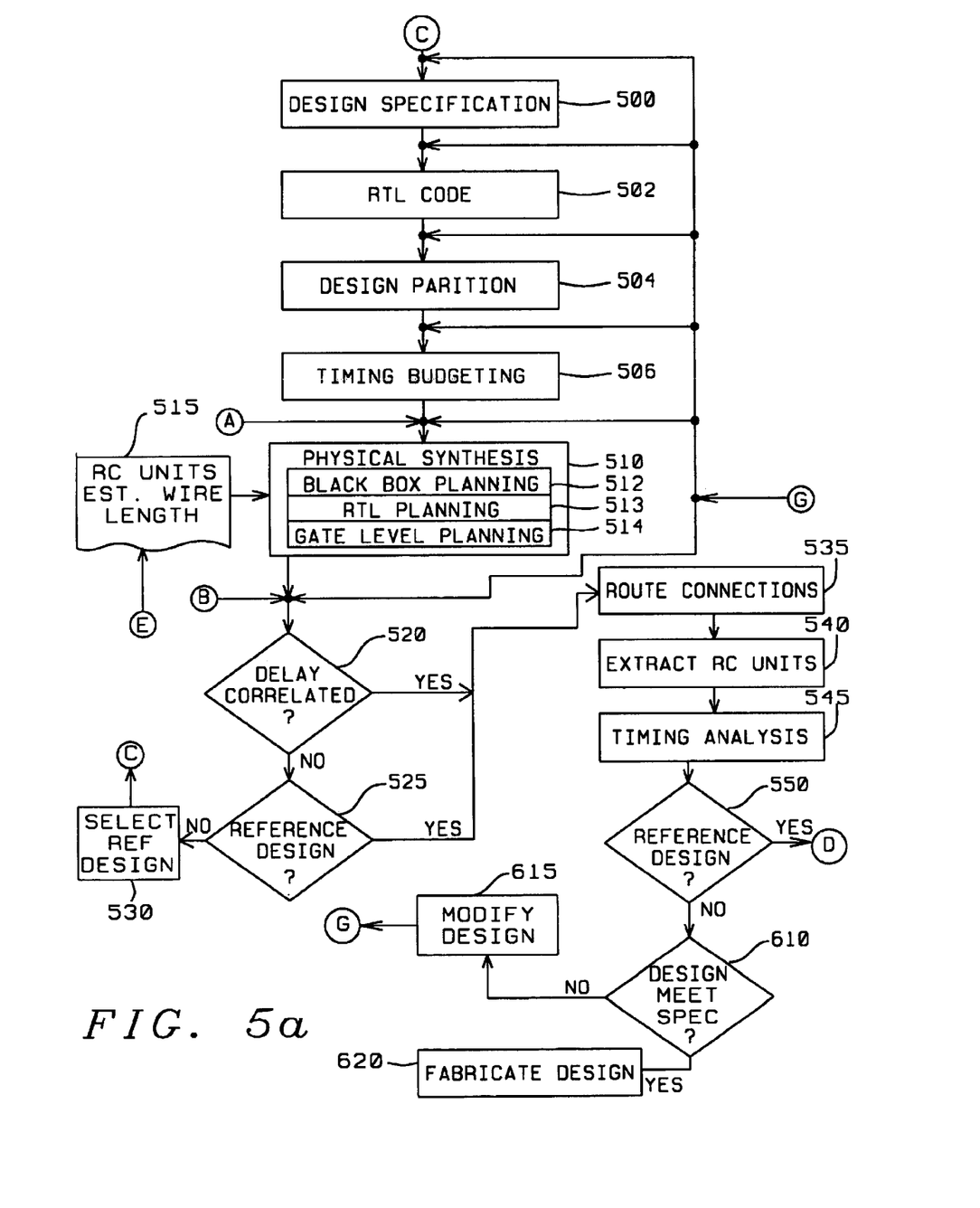
FIGS. 5a and 5b are process flow diagrams of an electronic design automation system of this invention.
Figure 5B:
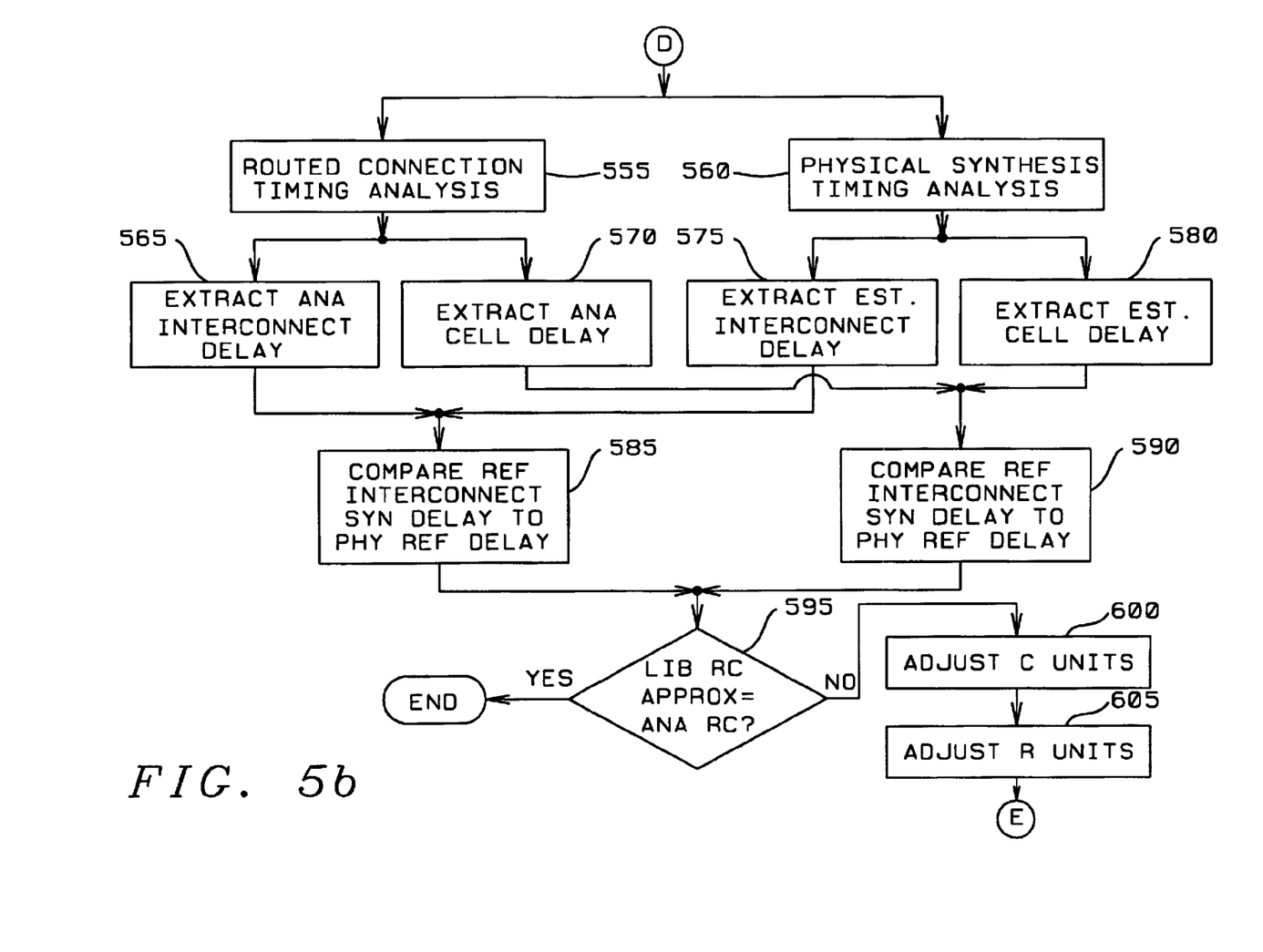
Figure 6:
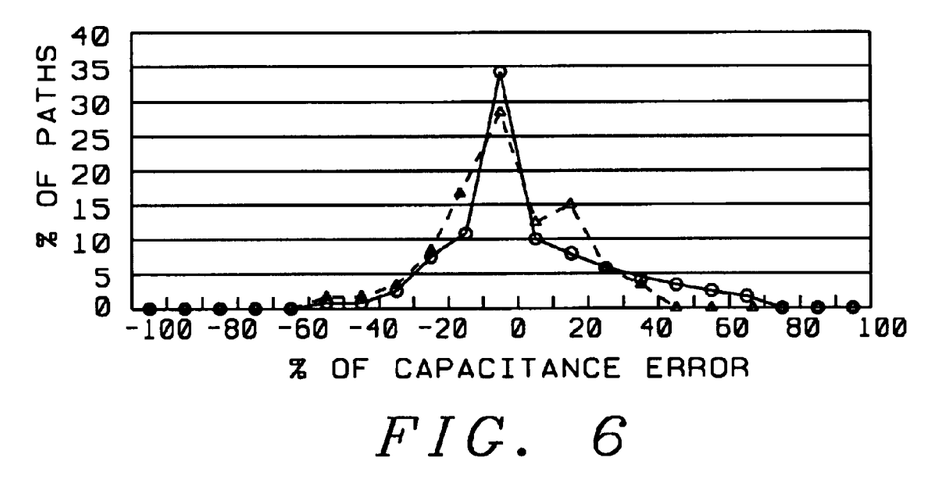
FIG. 6 is a graph illustrating the error between the capacitance of circuit interconnections estimated during synthesis and the capacitance of circuit interconnections calculated from actual physical wiring design of this invention.

As can be seen in the comparison of FIGS. 4a and 4b, if the resistance and capacitance values used for the preliminary estimates during the synthesis are more representative of the final routing of the interconnecting wire segment, the more accurate the preliminary design becomes and the less time and effort is expended in redesigning the integrated circuit to comply with the design specification. To make the resistance and capacitance unit values employed during a physical synthesis more representative of the calculated resistance and capacitance values of the routed interconnections, it is desirable to correct these resistance and capacitance values as the design process proceeds. Refer now to FIGS. 5a and 5b for a discussion of the method and apparatus to calibrate the resistances and capacitances units employed during physical synthesis for what is commonly referred to in the art as RTL-to-Placed Gate-Level Netlist synthesis.

The process begins with the creation of the high-level design specification (Box 500). As described above, the high-level design specification details the function of the integrated circuit, and the constraints of the integrated circuit such as physical size, voltage levels, current levels, power dissipation, frequency, and environmental factors (temperature, etc.). The circuit function is translated to a logic design written in a hardware description language such as VHDL or Verilog.

Generally, the structure of the integrated circuit is in register transfer language (RTL) and the hardware descriptor language is structured as the RTL code (Box 505).

The integrated circuit design is partitioned (Box 200) to allocate the functional units of the integrated circuit design to unique physical areas of the substrate onto which the integrated circuit is to be fabricated. The circuit specification contains certain performance and timing criteria that are to be achieved by the integrated circuit. These timing and performance constraints are then budgeted (Box 205) and allotted to the appropriate functional units of the integrated circuit design.

The RTL code (Box 505) is transferred to a program system that generates or synthesizes (Box 510) a circuit or gate level design from the hardware description of the integrated circuit. The physical synthesis (Box 510), as described in FIG. 2, provides the initial description of the physical structure that the integrated circuit is to have through the black box planning (Box 512), the RTL planning (Box 513), and the gate level planning (Box 514). During the physical synthesis (Box 510), the preliminary timing analysis is performed using the initial resistance and capacitance unit values with the initial wire length from the library database (Box 515). The timing analysis generates an estimate of the timing delays for the interconnecting paths of the circuits of the integrated circuits. In the method of this invention, the initial physical synthesis is performed by using the initially provided resistance and capacitance unit values (Box 515) with estimations for the length of the wiring interconnections generally created as a result of what is termed a "fast router." The routing is not complete and the length of wiring and precise layering of the lines not determined.

The estimated timing delays from the preliminary timing analysis within the physical synthesis (Box 510) are compared (Box 520) the timing analysis (Box 545) of the actual physical placement of the component circuits or the interconnecting wiring of the integrated circuit. On the initial process of the integrated circuit there would be no actual physical placement of the component circuits or the interconnecting wiring and therefore no timing analysis and thus no correlation of the estimated timing analysis (Box 520) and the actual timing analysis (Box 545) of the actual physical placement of the component circuits or the interconnecting wiring. The initial design of the integrated circuit is referred to as the reference design. The process queries (Box 535) if the current design pass is the reference design. If it is the reference design, the reference design has its component circuits placed (Box 530) and the interconnections of the component circuits routed (Box 535). The actual physical placement of the component circuits and the interconnections between the component circuits is analyzed to extract (Box 540) to determine the actual resistance and capacitance values of the interconnections and the capacitance values of the cells of the component circuits. An actual timing analysis (Box 545) is performed on the actual physical placement of the component circuits and the interconnections between the component circuit employing the extracted (Box 540) resistance and capacitance values.

The design is again queried (Box 550) to determine if the design is a reference design. If it is a reference design, the timing delay attributable to the interconnection between the component circuit is extracted (Box 556) from the estimated timing delays of the preliminary timing analysis (Box 515) and extracted (Box 560) from the calculated timing delays of the timing analysis (Box 545) of the actual physical placement of the component circuits or the interconnections of the component circuits. The result of the timing analysis of the physical structure of the reference design is retained (Box 555), as is the timing analysis estimates calculated during the physical synthesis (Box 510).

The analyzed interconnection delay from the timing analysis (Box 555) is extracted (Box 565) to identify the timing effects of the interconnections. Simultaneously, the contribution to the timing delay that results from the actual individual integrated circuit cells are extracted (Box 570) to identify the timing effects of the individual cells. Similarly, the delay effects of the interconnections as estimated by the timing analysis of the physical synthesis (Box 510) are identified and extracted (Box 575). The delay effects of the individual integrated circuit cells are simultaneously identified and extracted (Box 580).

The extracted (Box 565) interconnection delay as estimated during the timing estimation of the physical synthesis (Box 510) is compared (Box 585) to the extracted (Box 565) actual timing delay of the physical interconnections of the timing analysis (Box 555) of the routed (Box 535) interconnections. Simultaneously, the extracted (Box 580) cell delay as estimated during the timing estimation of the physical synthesis (Box 510) is compared (Box 590) to the extracted (Box 575) actual timing delay of the physical interconnections of the timing analysis (Box 555) of the routed (Box 545) interconnections.

If the comparisons (Boxes 585 and 590) indicate (Box 595) that the resistances and capacitances of the library database (Box 515) are correct, the process ends. However, if the comparisons (Boxes 585 and 590) indicate (Box 595) that the resistances and the capacitances of the library database (Box 515) are not correct, the resistance units and the capacitance units as extracted (Box 540) from the routed physical design are used to adjust (Boxes 600 and 605) the library database (Box 515). The reference design is then process through the physical synthesis (Box 515) again to verify the adjustment (Boxes 600 and 605) of the resistance and capacitance units are correlated (Box 520).

The correlation (Box 520) is accomplished by comparing the mean of the estimated delay of the physical synthesis versus the mean of the calculated actual delay resulting from the routing of the placed integrated circuit cells. Alternately, the peak delays of the distribution of the estimated delays are compared to the peak delays of the distribution of the analyzed delays of the placed and routed design are compared. A third correlation technique allows a percentage of the estimated timing delays to be more optimistic (the resistance and capacitance values of the estimated are lower than the actual analyzed values) than the actual timing delays.

This process is repeated until the estimated timing analysis of the physical synthesis (Box 510) and the reference timing analysis (Box 545) are correlated (Box 520). When the estimated timing analysis (Box 515) and the reference timing analysis (Box 545) are correlated (Box 520), an actual design is processed through Fe physical synthesis (Box 510). The interconnections of the placed component circuits of the actual integrated circuit design are then routed (Box 535) to determine the wiring segments of the interconnections. The resistance and capacitance of the wiring segments of the newly routed interconnections are extracted (Box 540) and a timing analysis (Box 545) is finally performed. Since this is not the reference design (Box 550), the designed integrated circuit is verified (Box 610). If the design does not meet the specification, the process is the design is modified (Box 615) and the process is re-executed depending on the modifications done. If the design meets the specification, the integrated circuit is fabricated (Box 620).

The physical synthesis (Box 510), the placing of the component circuits (Box 530), the routing of the interconnections of the component circuits (Box 535), the extraction (Box 540) of the resistance and capacitance values of the unit wiring segments of the interconnections, and the timing analysis (Box 550) is performed by various electronic design automation tools such as those provided by Synopsys, Inc. or Avantl, Inc. These tools with the components used to determine the adjustments of the resistance and capacitance unit values of the library (Box 580) for the electronic design automation system of this invention.

A second embodiment of this invention is commonly referred to in the art as the Gate-Level to Placed Gate-Level Netlist Synthesis. The Gate-Level to Placed Gate-Level Netlist Synthesis begins with the initial procedures of the process of FIG. 1 with the creation (Box 100) of the design specification, coding (Box 105) of the register transfer logic, and performing (Box 110) of the logic synthesis to create the listing of the component circuits with the attendant listing of the interconnections of the component circuits. Rather than completion of the process of FIG. 1, the listing of the component circuits as generated by the performing (Box 110) of the logic synthesis of FIG. 1 is placed with the physical synthesis (Box 510). The interconnections of the placed components circuit are routed (Box 535) and the resistance and capacitance values for each of the wiring segments of the interconnections are extracted (Box 540). The timing analysis (Box 545) of the integrated circuit is performed. Since this is the initial design of the integrated, it will be declared a reference design, and when queried (Box 550), the results of the timing analysis of the physical structure of the reference design is retained (Box 555), as is the timing analysis estimates calculated during the physical synthesis (Box 510).

The analyzed interconnection delay from the timing analysis (Box 555) is extracted (Box 565) to identify the timing effects of the interconnections. Simultaneously, the contribution to the timing delay that results from the actual individual integrated circuit cells are extracted (Box 570) to identify the timing effects of the individual cells. Similarly, the delay effects of the interconnections as estimated by the timing analysis of the physical synthesis (Box 510) are identified and extracted (Box 575). The delay effects of the individual integrated circuit cells are simultaneously identified and extracted (Box 580).

The extracted (Box 565) interconnection delay as estimated during the timing estimation of the physical synthesis (Box 510) is compared (Box 585) to the extracted (Box 565) actual timing delay of the physical interconnections of the timing analysis (Box 655) of the routed (Box 535) interconnections. Simultaneously, the extracted (Box 580) cell delay as estimated during the timing estimation of the physical synthesis (Box 510) is compared (Box 590) to the extracted (Box 575) actual timing delay of the physical interconnections of the timing analysis (Box 555) of the routed (Box 545) interconnections.

If the comparisons (Boxes 585 and 590) indicate (Box 595) that the resistances and capacitances of the library database (Box 515) are correct, the process ends. However, if the comparisons (Boxes 585 and 590) indicate (Box 595) that the resistances and the capacitances of the library database (Box 515) are not correct, the resistance units and the capacitance units as extracted (Box 540) from the routed physical design are used to adjust (Boxes 600 and 605) the library database (Box 515). The reference design is then process through the physical synthesis (Box 515) again to verify the adjustment (Boxes 600 and 605) of the resistance and capacitance units are correlated (Box 520).

This process is repeated using the coding (Box 105) of the register transfer logic and the listing of the component circuits with the attendant listing of the interconnections of the component circuits as generated by the performing (Box 110) of the logic synthesis of FIG. 1 until the estimated timing analysis from the physical synthesis (Box 510) and the reference timing analysis (Box 545) are correlated (Box 520). When the estimated timing analysis (Box 515) and the reference timing analysis (Box 545) are correlated (Box 520), the interconnections of the newly placed component circuits are then routed (Box 535) to determine the wiring segments of the interconnections. The resistance and capacitance of the wiring segments of the newly routed interconnections are extracted (Box 540) and a timing analysis (Box 545) is finally performed. Since this is not the reference design (Box 550), the designed integrated circuit is verified (Box 585). If the design does not meet the specification, the process is the design is modified (Box 595) and the process is re-executed depending on the modifications done. If the design meets the specification, the integrated circuit is fabricated (Box 595).

A third embodiment of this invention is commonly referred to in the art as the Placed Gate-Level Netlist to Placed Gate-Level Netlist Synthesis. The Placed Gate-Level Netlist to Placed Gate-Level Netlist Synthesis begins with the initial procedures of the process of FIG. 1 or FIG. 2 with the creation (Box 100) of the design specification and coding (Box 105) of the register transfer logic. In the case of FIG. 1, the logic synthesis is performed (Box 110) to create the listing of the component circuits with the attendant listing of the interconnections of the component circuits. In the case of FIG. 2, the physical synthesis is performed (Box 210) to create the listing of the component circuits with the attendant listing of the interconnections of the component circuits. The synthesized (Box 110 of FIG. 1 or Box 210 of FIG. 2) listing of the component circuits with the attendant listing of the interconnections of the component circuits are then placed (Box 120 of FIG. 1 or Box 220 of FIG. 2) to provide a listing of the locations of the component circuit upon the semiconductor substrate. Rather than completion of the process of FIG. 1 or FIG. 2, the interconnections of the placed component circuits are routed (Box 535), as shown in FIG. 5, and the resistance capacitance values for each of the wiring segments of the interconnections is extracted (Box 540). The timing analysis (Box 545) of the integrated circuit is performed. Since this is the initial design of the integrated, it will be declared a reference design, and when queried (Box 550), the results of the timing analysis of the physical structure of the reference design is retained (Box 555), as is the timing analysis estimates calculated during the physical synthesis (Box 510).

The analyzed interconnection delay from the timing analysis (Box 555) is extracted (Box 565) to identify the timing effects of the interconnections. Simultaneously, the contribution to the timing delay that results from the actual individual integrated circuit cells are extracted (Box 570) to identify the timing effects of the individual cells. Similarly, the delay effects of the interconnections as estimated by the timing analysis of 15, the physical synthesis (Box 510) are identified and extracted (Box 575). The delay effects of the individual integrated circuit cells are simultaneously identified and extracted (Box 580).

The extracted (Box 585) interconnection delay as estimated during the timing estimation of the physical synthesis (Box 510) is compared (Box 585) to the extracted (Box 565) actual timing delay of the physical interconnections of the timing analysis (Box 555) of the routed (Box 535) interconnections. Simultaneously, the extracted (Box 580) cell delay as estimated during the timing estimation of the physical synthesis (Box 510) is compared (Box 590) to the extracted (Box 575) actual timing delay of the physical interconnections of the timing analysis (Box 555) of the routed (Box 545) interconnections.

If the comparisons (Boxes 585 and 590) indicate (Box 595) that the resistances and capacitances of the wire length model (Box 115) of FIG. 1 or the library database (Box 215) of FIG. 2 are correct, the process ends. However, if the comparisons (Boxes 585 and 590) indicate (Box 595) that the resistances and the capacitances of the wire length model (Box 115) of FIG. 1 or the library database (Box 215) of FIG. 2 are not correct, the resistance units and the capacitance units as extracted (Box 540) from the routed physical design are used to adjust (Boxes 600 and 605) the wire length model (Box 115) of FIG. 1 or the library database (Box 215) of FIG. 2. The reference design is then process through the placement (Box 120) of FIG. 1 or the physical synthesis (Box 210) of FIG. 2 again to verify the adjustment (Boxes 600 and 605) of the resistance and capacitance units are correlated (Box 520).

This process is repeated using the coding (Box 105) of the register transfer logic and the listing of the component circuits with the attendant listing of the interconnections of the component circuits as generated by the performing (Box 110) of the logic synthesis and the placement of the component circuits (Box 120) of FIG. 1 or the performing (Box 210) of the physical synthesis and the placement of the component circuits (Box 220) of FIG. 1. The process is repeated until the estimated timing analysis of the wire length model (Box 115) of FIG. 1 or the physical synthesis (Box 210) of FIG. 2 and the reference timing analysis (Box 545) are correlated (Box 520). When the estimated timing analysis of the wire length model (Box 115) of FIG. 1 or the physical synthesis (Box 210) of FIG. 2 and the reference timing analysis (Box 545) are correlated (Box 520), the components are placed (Box 530) one final time to make any necessary adjustments for congestion and length of the interconnections of the component circuits. The interconnections of the newly placed component circuits are then routed (Box 535) to determine the wiring segments of the interconnections. The resistance and capacitance of the wiring segments of the newly routed interconnections are extracted (Box 540) and a timing analysis (Box 545) is finally performed. Since this is not the reference design (Box 550), the designed integrated circuit is verified (Box 585). If the design does not meet the specification, the process is the design is modified (Box 595) and the process is executed depending on the modifications done. If the design meets the specification, the integrated circuit is fabricated (Box 595).

Each process step of the process of FIGS. 5a and 5b is executed by a tool or apparatus designed particularly for the step of the process. It is well known in the art that while the above describes a method and system for the automatic design of an integrated circuit upon a semiconductor substrate, each tool or apparatus as described is, in fact, implemented as a program code for execution on a computing system. The program code is retained in media such as storage nodes of the cluster network of computer systems or a global communication network such as the Internet, or stored on storage media such as a read only memory (ROM), an electro-optical disk or a magnetic disk. The program code executed by the computing system executes the method of FIG. 5.

While this invention has been particularly shown and described with reference to the preferred embodiments thereof, it will be understood by those skilled in the art that various changes in form and details may be made without departing from the spirit and scope of the invention.

The invention claimed is:

1. A resistance and capacitance unit value calibration method employed in a synthesis of an electronic device comprising the steps of:

a) performing a synthesis of a preliminary description of said electronic device to form a listing of component circuits of said electronic device including a listing of interconnections of said electronic devices, said synthesis using said resistance and capacitance unit values to determine said listing of the component circuits;

b) performing a placing of said component circuits to create a listing describing physical locations of said component circuits within said electronic device;

c) performing a routing of said interconnections to create a listing describing a network of physical wire segments that form each interconnection of the component circuits;

d) performing a timing analysis of said electronic device to determine delay created by the component circuit and the networks of physical wire segments;

e) extracting a physical interconnect delay from the timing analysis of said electronic device;

f) extracting an estimated interconnect delay from a timing estimate performed during the timing synthesis;

g) comparing the physical interconnect delay with the estimated interconnect delay;

h) determining a resistance and capacitance unit error value;

i) adjusting the resistance and capacitance unit values used during the timing synthesis with said resistance and capacitance unit error value to calibrate said resistance and capacitance unit values; and j) reiterating steps a) through i) until the physical interconnect delay and the estimated interconnect delay are correlated.

2. The method of claim 1 wherein the preliminary description of said electronic device is a hardware descriptor language.

3. The method of claim 2 wherein the hardware descriptor language is register transfer language.

4. A resistance and capacitance unit value calibration apparatus employed in a synthesis of an electronic device comprising:

a) means for performing a synthesis of a preliminary description of said electronic device to form a listing of component circuits of said electronic device including a listing of interconnections of said electronic devices, said synthesis using said resistance and capacitance unit values to determine said listing of the component circuits;

b) means for performing a placing of said component circuits to create a listing describing physical locations of said component circuits within said electronic device;

c) means for performing a routing of said interconnections to create a listing describing a network of physical wire segments that form each interconnection of the component circuits;

d) means for performing a timing analysis of said electronic device to determine delay created by the component circuit and the networks of physical wire segments;

e) means for extracting a physical interconnect delay from the timing analysis of said electronic device;

f) means for extracting an estimated interconnect delay from a timing estimate performed during the timing synthesis;

g) means for comparing the physical interconnect delay with the estimated interconnect delay;

h) means for determining a resistance and capacitance unit error value;

i) means for adjusting the resistance and capacitance unit values used during the timing synthesis with said resistance and capacitance unit error value to calibrate said resistance and capacitance unit values; and j) means for executing means a) through i) until the physical interconnect delay and the estimated interconnect delay are correlated.

5. The apparatus of claim 4 wherein the preliminary description of said electronic device is a hardware descriptor language.

6. The apparatus of claim 5 wherein the hardware descriptor language is register transfer language.

7. A method for designing an electronic device comprising the steps of:

creating a preliminary description of said electronic device including constraints to be employed for said designing;

calibrating resistance and capacitance unit values employed in a synthesis of an electronic device by the steps of:

a) performing a synthesis of the preliminary description of said electronic device to form a listing of component circuits of said electronic device including a listing of interconnections of said electronic devices, said synthesis using said resistance and capacitance unit values to determine said listing of the component circuits, b) performing a placing of said component circuits to create a listing describing physical locations of said component circuits within said electronic device, c) performing a routing of said interconnections to create a listing describing a network of physical wire segments that form each interconnection of the component circuits, d) performing a timing analysis of said electronic device to determine delay created by the component circuit and the networks of physical wire segments, e) extracting a physical interconnect delay from the timing analysis of said electronic device, f) extracting an estimated interconnect delay from a timing estimate performed during the timing synthesis, g) comparing the physical interconnect delay with the estimated interconnect delay, h) determining a resistance and capacitance unit error value, i) adjusting the resistance and capacitance unit values used during the timing synthesis with said resistance and capacitance unit error value to calibrate said resistance and capacitance unit values, and j) reiterating steps a) through i) until the physical interconnect delay and the estimated interconnect delay are correlated, performing a synthesis of the preliminary description of said electronic device to form a listing of component circuits of said electronic device including a listing of interconnections of said electronic devices, said synthesis using said resistance and capacitance unit values to determine said listing of the component circuits;

performing a placing of said component circuits to create a listing describing physical locations of said component circuits within said electronic device;

performing a routing of said inter connections to create a listing describing a network of physical wire segments that form each interconnection of the component circuits;

verifying that the design of the electronic device adheres to the preliminary description of the electronic device; and if the design of the electronic device adheres to the preliminary description of the electronic device, transferring said design for fabrication.

8. The method of claim 7 herein the preliminary description of said electronic device is a hardware descriptor language.

9. The method of claim 8 wherein the hardware descriptor language is register transfer language.

10. An apparatus for designing an electronic device comprising:

means for creating a preliminary description of said electronic device including constraints to be employed for said designing;

means for calibrating resistance and capacitance unit values employed in a synthesis of an electronic device comprising:

a) means for performing a synthesis of the preliminary description of said electronic device to form a listing of component circuits of said electronic device including a listing of interconnections of said electronic devices, said synthesis using said resistance and capacitance unit values to determine said listing of the component circuits, b) means for performing a placing of said component circuits to create a listing describing physical locations of said component circuits within said electronic device, c) means for performing a routing of said interconnections to create a listing describing a network of physical wire segments that form each interconnection of the component circuits, d) means for performing a timing analysis of said electronic device to determine delay created by the component circuit and the networks of physical wire segments, e) means for extracting a physical interconnect delay from the timing analysis of said electronic device, f) means for extracting an estimated interconnect delay from a timing estimate performed during the timing synthesis, g) means for comparing the physical interconnect delay with the estimated interconnect delay, h) means for determining a resistance and capacitance unit error value, i) means for adjusting the resistance and capacitance unit values used during the timing synthesis with said resistance and capacitance unit error value to calibrate said resistance and capacitance unit values, and j) means for repetitively executing the means of a) through i) until the physical interconnect delay and the estimated interconnect delay are correlated;

means for performing a synthesis of the preliminary description of said electronic device to form a listing of component circuits of said electronic device including a listing of interconnections of said electronic devices, said synthesis using said resistance and capacitance unit values to determine said listing of the component circuits;

means for performing a placing of said component circuits to create a listing describing physical locations of said component circuits within said electronic device;

means for performing a routing of said interconnections to create a listing describing a network of physical wire segments that form each interconnection of the component circuits;

means for verifying that the design of the electronic device adheres to the preliminary description of the electronic device; and means for transferring said design for fabrication, which are operable if the design of the electronic device adheres to the preliminary description of the electronic device.

11. The apparatus of claim 10 wherein the preliminary description of said electronic device is a hardware descriptor language.

12. The apparatus of claim 11 wherein the hardware descriptor language is register transfer language.

13. An electronic device design automation system comprising:

a design data retaining device containing a preliminary description of an electronic device;

a library data device containing a listing of electrical components usable within said electronic device, a listing of physical parameters for said electrical components and a listing of constraints to be employed for designing and fabricating said electronic device, wherein said listing of physical parameters includes resistance and capacitance unit values;

a physical synthesizer in communication with the design retaining device and the library retaining device to receive the preliminary description of the electronic device and from the listing of electrical components usable within said electronic device, the listing of physical parameters for said electrical components and the listing of constraints to be employed for designing and fabricating said electronic device generates a listing of component circuits of said electronic device including a listing of interconnections of said electronic devices, said synthesis using said resistance and capacitance unit values to determine said listing of the component circuits;

an electrical component placing apparatus in communication with the physical synthesizer to receive the listing of the component circuits and to create a physical arrangement said component circuits, a wire routing apparatus in communication with the physical synthesizer and the electrical component placing apparatus to receive the listing of the component circuits and the physical arrangement of the component circuits to create an interconnection listing describing all physical interconnections between the electrical components;

a resistance and capacitance extraction apparatus in communication with the wire routing apparatus to determine a resistance value and a capacitance value for each unit segment of each physical interconnection between the electrical components;

a timing analyzer in communication with the physical synthesizer to receive the listing of electrical components and the wire routing apparatus to receive the physical interconnections between the electrical components to determine a timing analysis describing actual delays of signals propagated through the electrical components and the interconnections of the electrical components; and an unit resistance and capacitance value calibration apparatus in communication with the physical synthesizer to receive a preliminary timing estimate, with the timing analyzer to receive the timing analysis, and with the resistance and capacitance extraction apparatus to receive the resistance value and the capacitance value for each unit segment of each physical interconnection between the electrical components, said resistance adjustment apparatus compares the preliminary timing estimate with the timing analysis and from the resistance value and the capacitance value of each segment of the physical interconnections derives an unit resistance adjustment factor and an unit capacitance adjustment factor to correct the resistance and capacitance unit values in the library data devices;

wherein said electronic device design automation system is operated repetitively until the preliminary timing estimate and the timing analysis are correlated, at which time said electronic device is design and if meeting a design specification for said electronic device, said electronic device is fabricated.

14. The system of claim 13 wherein the preliminary description of said electronic device is a hardware descriptor language.

15. The system of claim 14 wherein the hardware descriptor language is register transfer language.

16. A medium for retaining a computer program which, when executed on a computing system, calibrates resistance and capacitance unit values employed in a synthesis of an electronic device, said computer program comprising the steps of:
   a) performing a synthesis of preliminary description of said electronic device to form a listing of component circuits of said electronic device including a listing of interconnections of said electronic devices, said synthesis using said resistance and capacitance unit values to determine said listing of the component circuits;
   b) performing a placing of said component circuits to create a listing describing physical locations of said component circuits within said electronic device;
   c) performing a routing of said interconnections to create a listing describing a network of physical wire segments that form each interconnection of the component circuits;
   d) performing a timing analysis of said electronic device to determine delay created by the component circuit and the networks of physical wire segments;
   e) extracting a physical interconnect delay from the timing analysis of said electronic device;
   f) extracting an estimated interconnect delay from a timing estimate performed during the timing synthesis;
   g) comparing the physical interconnect delay with the estimated interconnect delay;
   h) determining a resistance and capacitance unit error value;
   i) adjusting the resistance and capacitance unit values used during the timing synthesis with said resistance and capacitance unit error value to calibrate said resistance and capacitance unit values; and
   j) reiterating steps a) through i) until the physical interconnect delay and the estimated interconnect delay are correlated.

17. The medium of claim 16 wherein said medium is selected from the set of media consisting of storage nodes of a computer network or a global communication network, a random access memory (RAM), a read only memory (ROM), an electro-optical disk, or a magnetic disk.

18. The medium of claim 16 wherein the preliminary description of said electronic device is a hardware descriptor language.

19. The medium of claim 18 wherein the hardware descriptor language is register transfer language.

20. A medium for retaining a computer program which, when executed on a computing system, automates a designing of an electronic device, said computer program comprising the steps of:
   creating a preliminary description of said electronic device including constraints to be employed for said designing;
   calibrating resistance and capacitance unit values employed in a synthesis of an electronic device by the steps of:
      a) performing a synthesis of the preliminary description of said electronic device to form a listing of component circuits of said electronic device including a listing of interconnections of said electronic devices, said synthesis using said resistance and capacitance unit values to determine said listing of the component circuits,
      b) performing a placing of said component circuits to create a listing describing physical locations of said component circuits within said electronic device,
      c) performing a routing of said interconnections to create a listing describing a network of physical wire segments that form each interconnection of the component circuits,
      d) performing a timing analysis of said electronic device to determine delay created by the component circuit and the networks of physical wire segments,
      e) extracting a physical interconnect delay from the timing analysis of said electronic device,
      f) extracting an estimated interconnect delay from a timing estimate performed during the timing synthesis,
      g) comparing the physical interconnect delay with the estimated interconnect delay,
      h) determining a resistance and capacitance unit error value,
      i) adjusting the resistance and capacitance unit values used during the timing synthesis with said resistance and capacitance unit error value to calibrate said resistance and capacitance unit values, and
      j) reiterating steps a) through i) until the physical interconnect delay and the estimated interconnect delay are correlated;
   performing a synthesis of the preliminary description of said electronic device to form a listing of component circuits of said electronic device including a listing of interconnections of said electronic devices, said synthesis using said resistance and capacitance unit values to determine said listing of the component circuits;
   performing a placing of said component circuits to create a listing describing physical locations of said component circuits within said electronic device;
   performing a routing of said interconnections to create a listing describing a network of physical wire segments that form each interconnection of the component circuits;
   verifying that the design of the electronic device adheres to the preliminary description of the electronic device; and
   if the design of the electronic device adheres to the preliminary description of the electronic device, transferring said design for fabrication.

21. The medium of claim 20 wherein said medium is selected from the set of media consisting of storage nodes of a computer network or a global communication network, a random access memory (RAM), a read only memory (ROM), an electro-optical disk, or a magnetic disk.

22. The medium of claim 20 wherein the preliminary description of said electronic device is a hardware descriptor language.

23. The medium of claim 22 wherein the hardware descriptor language is register transfer language.

* * * * *